(12) United States Patent
Li et al.

(10) Patent No.: US 8,815,719 B2
(45) Date of Patent: Aug. 26, 2014

(54) DEFECT-FREE JUNCTION FORMATION USING OCTADECABORANE SELF-AMORPHIZING IMPLANTS

(75) Inventors: Jiping Li, Palo Alto, CA (US); Aaron Muir Hunter, Santa Cruz, CA (US); Bruce E. Adams, Portland, OR (US); Theodore Moffitt, Hillsboro, OR (US); Stephen Moffatt, St. Lawrence (GB)

(73) Assignee: Applied Materials, Inc., Santa Clara, CA (US)

(*) Notice: Subject to any disclaimer, the term of this patent is extended or adjusted under 35 U.S.C. 154(b) by 9 days.

(21) Appl. No.: 13/418,069

(22) Filed: Mar. 12, 2012

(65) Prior Publication Data

US 2012/0171853 A1  Jul. 5, 2012

Related U.S. Application Data

(63) Continuation of application No. 12/563,746, filed on Sep. 21, 2009, now Pat. No. 8,067,302.

(51) Int. Cl.
*H01L 21/26* (2006.01)
*H01L 21/265* (2006.01)

(52) U.S. Cl.
CPC .............. *H01L 21/26513* (2013.01)
USPC .................. 438/513; 257/E21.347

(58) Field of Classification Search
USPC .................. 438/513; 257/E21.347
See application file for complete search history.

(56) References Cited

U.S. PATENT DOCUMENTS

| | | | |
|---|---|---|---|
| 4,341,589 A | 7/1982 | Grabmaier | |
| 4,456,489 A | 6/1984 | Wu | |
| 6,479,828 B2 | 11/2002 | Perel | |
| 6,482,722 B2 | 11/2002 | Kunii et al. | |
| 6,897,118 B1 | 5/2005 | Poon et al. | |
| 7,109,098 B1* | 9/2006 | Ramaswamy et al. | 438/513 |
| 7,148,131 B1 | 12/2006 | Suvkhanov et al. | |
| 7,396,745 B2 | 7/2008 | Borland et al. | |
| 7,410,890 B2 | 8/2008 | Kirkpatrick et al. | |
| 7,491,953 B2 | 2/2009 | Horsky et al. | |
| 7,494,852 B2 | 2/2009 | Bedell et al. | |
| 7,609,003 B2 | 10/2009 | Horsky et al. | |
| 2003/0146458 A1 | 8/2003 | Horiuchi et al. | |
| 2004/0132293 A1 | 7/2004 | Takayama et al. | |
| 2004/0253839 A1 | 12/2004 | Shimizu et al. | |
| 2005/0174313 A1 | 8/2005 | Kawachi | |
| 2006/0063360 A1* | 3/2006 | Singh et al. | 438/510 |
| 2006/0088969 A1 | 4/2006 | Jain | |
| 2006/0097193 A1 | 5/2006 | Horsky et al. | |
| 2008/0122005 A1 | 5/2008 | Horsky et al. | |
| 2008/0182430 A1 | 7/2008 | Chen et al. | |
| 2009/0197428 A1 | 8/2009 | Takahashi et al. | |

OTHER PUBLICATIONS

T. Aoki, et al.; "Cluster species and cluster size dependence of damage formation by cluster ion impact" (reprint version); Nucl. Instr. & Meth. B 206 (2003) pp. 861-865.

(Continued)

*Primary Examiner* — Matthew Reames
(74) *Attorney, Agent, or Firm* — Patterson & Sheridan, LLP

(57) ABSTRACT

A method and apparatus for implanting a semiconductor substrate with boron clusters. A substrate is implanted with octadecaborane by plasma immersion or ion beam implantation. The substrate surface is then annealed to completely dissociate and activate the boron clusters. The annealing may take place by melting the implanted regions or by a sub-melt annealing process.

17 Claims, 7 Drawing Sheets

(56) References Cited

OTHER PUBLICATIONS

P. G. Simpson, et al.; "Molecular structure of B18H22"; Department of Chemistry, Harvard University, Jul. 30, 1962, p. 1490.

M. S. Ameen, et al.; "Properties of ultralow energy boron implants using octadecaborane"; J. Vac. Sci. Technol. B 26(1), Jan./Feb. 2008, pp. 373-376.

B. Chang, et al.; "Octadecaborane implant technology for 72nm node stack DRAM p+ poly gate doping process"; IEEE 978-1-4244-1738-4/08 (2008).

Y. Kawasaki, et al.; "Ultra-shallow junction formation by B18H22 ion implantation"; Nucl. Instr. & Meth. In Phys. Res. B 237 (2005) pp. 25-29.

"Molecular Implantation: Answer the call for low energy productivity"; Axcelis, Jul. 16, 2007.

C. Huynh, et al.; "Properties of octadecaborane-based ULE boron implants"; SolidState Technology, PenWell Corporation, Tulsa, OK, Aug. 2007.

J. Borland, et al.; Annealing techniques for optimizing 45nm-node USJs ; SolidState Technology, PenWell Corporation, Tulsa, OK, May 2006.

D. Adams, et al.; "A vaporizer for decaborane and octadecaborane"; CP866, Ion Implantation Technology, 2006 American Institute of Physics 978-0/7354-0365-9/06 (2006) pp. 178-181.

L. Marques, et al.; "Characterization of octadecaborane impination into Si using molecular dynamics"; Physical Review B 74, 201201(R) (2006) pp. 201201-1-201201-4.

PCT International Search Report and Written Opinion dated Apr. 29, 2010 for International Application No. PCT/US2009/057708.

USPTO Office Action dated Mar. 11, 2011, in U.S. Appl. No. 12/563,746.

\* cited by examiner

DEFECT-FREE JUNCTION FORMATION USING OCTADECABORANE SELF-AMORPHIZING IMPLANTS

CROSS-REFERENCE TO RELATED APPLICATIONS

This application is a continuation of U.S. application Ser. No. 12/563,746 filed Sep. 21, 2009 now U.S. Pat. No. 8,067,302.

FIELD

Embodiments described herein relate to semiconductor manufacturing methods. More specifically, embodiments of the invention encompass methods of doping semiconductor substrates.

BACKGROUND

As semiconductor technology progresses, devices formed on semiconductor substrates grow smaller. As devices grow smaller, manufacturers are continually challenged to develop productive processes for making the devices. Currently, manufacturing processes are being deployed to make devices having critical dimension of 45 nm. Researchers are busy developing next generation processes for devices having critical dimension of 20 nm or less. At these extreme dimensions, implanting dopants in a substrate becomes forbidding. In a traditional boron doping process, for example, boron atoms are directed toward a substrate with sufficient energy to penetrate the crystal lattice to a desired depth, and the substrate is then annealed to distribute the boron and activate it (attach it to the crystal network). As device dimensions grow smaller, control of implantation depth becomes more critical. Next generation devices are expected to have junctions no more than about 50 atomic layers deep.

Implantation problems arise as junction depth diminishes. Because the ions must travel more slowly to avoid implanting too deeply, the repulsive charge among like-charged ions forces them to diverge from their intended path. To compensate for this effect, fast-moving ions are magnetically decelerated near the surface of the substrate. Beam deceleration, however, results in "energy contamination," arising from exchange of charge between fast-moving ions and fugitive neutral particles during or prior to deceleration. The fast-moving neutralized particles are unaffected by the beam decelerator and implant deeply into the substrate.

Small ions also channel through the crystal lattice. Because the crystal lattice has open spaces large enough for many ions to pass unimpeded, more ions will travel down these "channels", resulting in highly variable implant depth. To reduce the tendency to channel, many manufacturers have resorted to "pre-amorphizing" the substrate surface to remove any opportunity for channeling. Pre-amorphization may also improve implant dose by opening more space within the solid matrix for ions to penetrate. Pre-amorphized substrates require more annealing, however, to activate dopants because the crystal structure is completely disrupted to a considerable depth and must be repaired. This leads to unwanted dopant diffusion and residual EOR damage.

Thus, there is a continuing need for better methods of implanting dopants in a shallow junction with high dopant dose and activation, low sheet resistance, and even distribution of dopants.

SUMMARY

Embodiments described herein provide a method of treating a substrate, comprising implanting boron macromolecules into a surface of the substrate, melting the surface of the substrate implanted with the boron macromolecules, resolidifying the surface of the substrate implanted with the boron macromolecules, and annealing the surface of the substrate. In some embodiments, the boron macromolecules comprise boron clusters having at least sixteen boron atoms.

Other embodiments provide a method of treating a substrate, comprising implanting octadecaborane into the surface of the substrate, and annealing implanted regions of the substrate by repeatedly heating and cooling the implanted regions.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments and are therefore not to be considered limiting in scope, because other equally effective embodiments may be devised.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally provide methods of doping a semiconductor substrate with boron. A substrate is provided to an implant chamber. A gas mixture containing boron macromolecules is provided to the chamber. The boron macromolecules are ionized and accelerated toward the substrate with energy selected to accomplish a shallow implant of the boron macromolecules into a surface of the substrate. The boron macromolecules penetrate and amorphize the substrate surface and break apart into atoms or small clusters. The boron dopant is then activated using an anneal process.

Figure 1A:
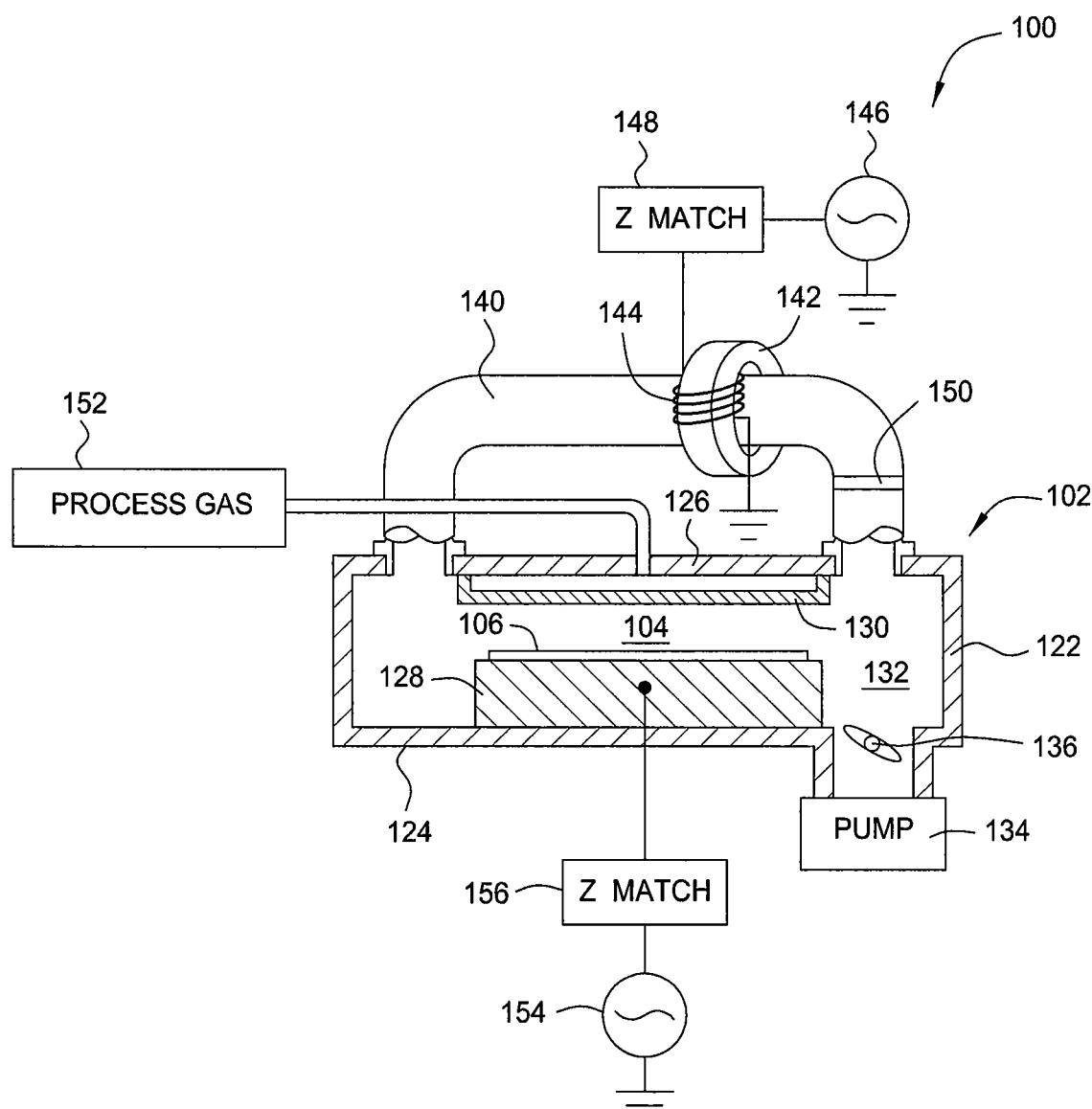
FIG. 1A is a schematic cross-sectional view of an apparatus according to one embodiment.

FIG. 1A depicts a plasma reactor 100 that may be utilized to practice ion implantation, oxide layer formation, and capping layer formation according to one embodiment of the invention. One suitable reactor which may be adapted to practice the invention is a P3i™ reactor, available from Applied Materials, Inc., of Santa Clara, Calif. Another reactor which may be adapted to practice the invention is described in U.S. patent application Ser. No. 11/608,357. It is contemplated that the methods described herein may be practiced in other suitably adapted plasma reactors, including those from other manufacturers.

The plasma reactor 100 includes a chamber body 102 having a bottom 124, a top 126, and side walls 122 enclosing a process region 104. A substrate support assembly 128 is supported from the bottom 124 of the chamber body 102 and is adapted to receive a substrate 106 for processing. A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A gas source 152 is coupled to the gas distribution plate 130 to supply gaseous precursor compounds for processes performed on the substrate 106.

Figure 1B:
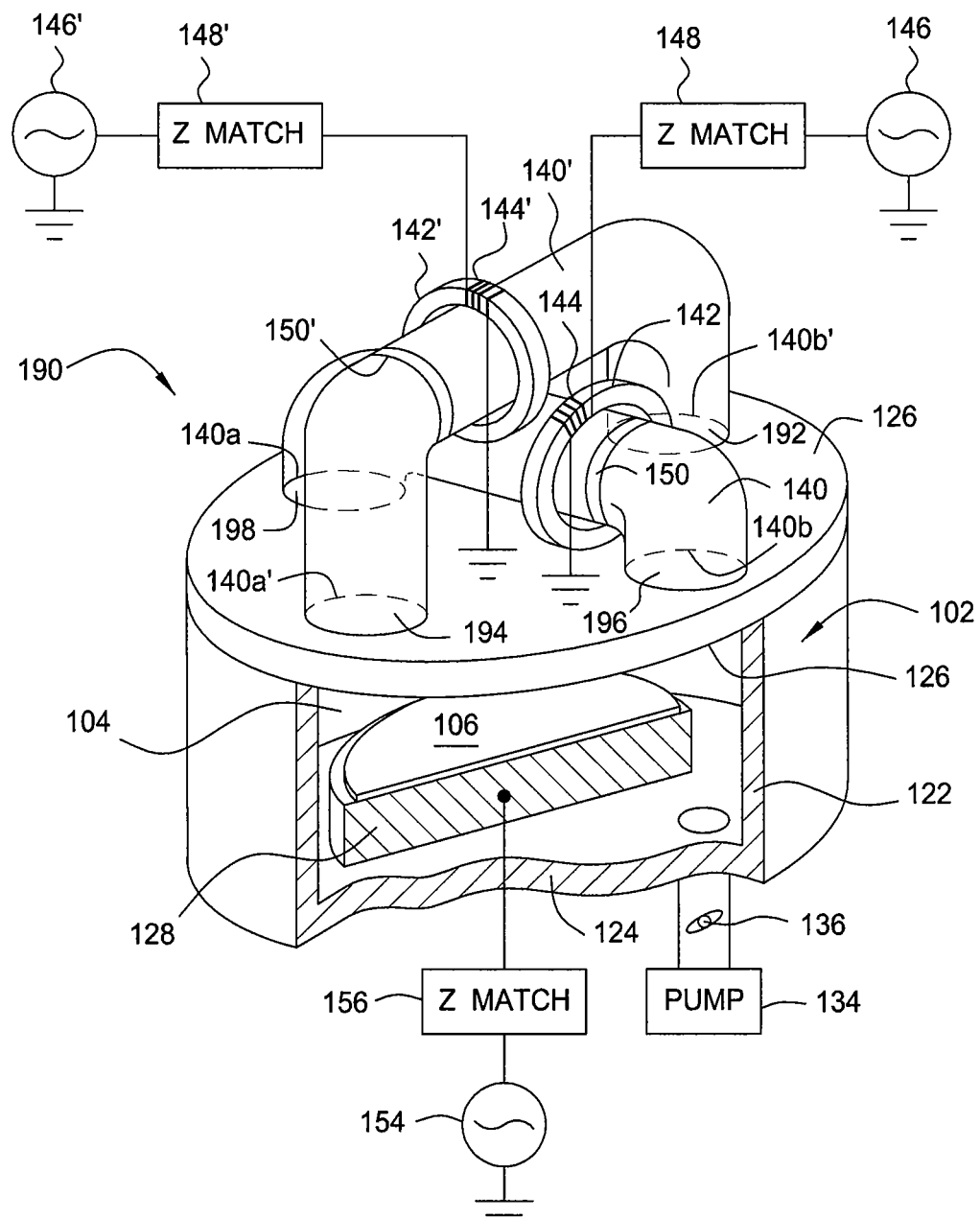
FIG. 1B is a perspective view of the apparatus of FIG. 1A.

The reactor 100 depicted in FIG. 1A further includes a plasma source 190 best shown in the perspective view of FIG. 1B. The plasma source 190 includes a pair of separate external reentrant conduits 140, 140' mounted on the outside of the top 126 of the chamber body 102 disposed transverse to one another (or orthogonal to one another, as shown in the exemplary embodiment depicted in FIG. 1B). The first external conduit 140 has a first end 140a coupled through an opening 198 formed in the top 126 into a first side of the process region 104 in the chamber body 102. A second end 140b has an opening 196 coupled into a second side of the process region 104. The second external reentrant conduit 140b has a first end 140a' having an opening 194 coupled into a third side of the process region 104 and a second end 140b' having an opening 192 into a fourth side of the process region 104. In one embodiment, the first and second external reentrant conduits 140, 140' are configured to be orthogonal to one another, thereby providing the two ends 140a, 140a', 140b, 140b' of each external reentrant conduits 140, 140' disposed at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may be configured as other distributions utilized to provide uniform plasma distribution into the process region 104.

Magnetically permeable torroidal cores 142, 142' surround a portion of a corresponding one of the external reentrant conduits 140, 140'. The conductive coils 144, 144' are coupled to respective RF plasma source power generators 146, 146' through respective impedance match circuits or elements 148, 148'. Each external reentrant conduit 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF plasma bias power generator 154 coupled to the substrate support assembly 128 through an impedance match circuit or element 156.

Referring back to FIG. 1A, process gases including gaseous compounds supplied from the process gas source 152 are introduced through the overhead gas distribution plate 130 into the process region 104. RF plasma source power generator 146 is coupled from the power applicator to gases supplied in the conduit 140, which creates a circulating plasma current in a first closed torroidal path including the external reentrant conduit 140 and the process region 104. Also, RF plasma source power generator 146' may be coupled from the other power applicator to gases in the second conduit 140', which creates a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF plasma source power generators 146, 146', which may be the same or slightly offset from one another.

In one embodiment, the process gas source 152 provides different process gases that may be utilized to provide ions implanted to the substrate 106. The power of each plasma source power generator 146, 146' is operated so that their combined effect efficiently dissociates the process gases supplied from the process gas source 152 and produces a desired ion flux at the surface of the substrate 106. The power of the RF plasma bias power generator 154 is controlled at a selected level at which the ion energy dissociated from the process gases may be accelerated toward the substrate surface and implanted at a desired depth below the top surface of the substrate 106 with desired ion concentration. For example, with relatively low RF power, such as less than about 50 eV, relatively low plasma ion energy may be obtained.

A gas mixture comprising boron macromolecules is provided to a chamber having a substrate disposed therein. Embodiments of the invention may also be practiced using a QUANTUM® X Plus implanter available from Applied Materials, Inc., of Santa Clara, Calif., or equivalent devices from other manufacturers. The boron macromolecules may comprise any mixture of stable boron macromolecules, including but not limited to the boron hydrides $B_xH_y$, wherein x is between about 6 and about 20, and y is between about 12 and about 24. In many embodiments, boron clusters or macromolecules used for implantation will have at least 16 boron atoms each. Some exemplary boron hydride macromolecules include octadecaborane ($B_{18}H_{22}$), decaborane ($B_{10}H_{14}$), hexaborane ($B_6H_{10}$), octaborane ($B_8H_{12}$), and hexadecaborane ($B_{16}H_{20}$). Octadecaborane is preferred because it may be ionized without decomposing under processing conditions. Octadecaborane also transports a high quantity of boron to a substrate at very low energy without the difficulties enumerated above. Because octadecaborane ions have a high mass-to-charge ratio, the tendency for the ions to diverge is sharply reduced, allowing low energy implant with none of the challenges described above.

In one embodiment, octadecaborane ($B_{18}$) is vaporized by heating to a sublimation temperature. $B_{18}$ may be vaporized using a Clusterlon® vaporizer available from SemEquip, Inc., of North Billerica, Mass., or equivalent source systems available from other manufacturers. The $B_{18}$ vapor is then provided to a chamber or device for implanting into a surface of a substrate.

In a plasma-immersion type device, the $B_{18}$ vapor is provided to an ionizing zone formed inside a gas distribution apparatus. RF power is coupled to the ionizing zone to ionize the $B_{18}$. Typically, flow of a carrier gas will be established at between about 1,000 sccm and about 5,000 sccm, such as between about 2,000 sccm and about 4,000 sccm, for example about 3,000 sccm. The carrier gas may be any gas non-reactive under processing conditions, such as helium or argon. RF power is coupled into the gas flow, and then a pulse of $B_{18}$ vapor is provided to the chamber to form a gas mixture in the gas distribution apparatus. The pulse of $B_{18}$ vapor may be provided for about 1 second at a flowrate between about 500 sccm and about 2,000 sccm, such as between about 700 sccm and about 1,200 sccm, for example about 1,000 sccm. The ionizing RF power may be coupled into the ionizing zone at between about 100 W and about 500 W, such as between about 200 W and about 400 W, for example about 300 W. The RF power may be coupled into the ionizing zone by use of capacitative coupling using, for example, parallel plate electrodes, or by inductive coupling. In some embodiments, greater than 90% of the $B_{18}$ molecules are ionized, such as greater than 95%, for exampler greater than 99%.

The $B_{18}$ ions flow through the ionizing zone into the chamber through the gas distribution apparatus. In some embodiments, the $B_{18}$ ions may be accelerated toward the substrate surface by application of an electrical bias to the gas distributor, the substrate support, or both. The bias may be a DC bias or an RF bias. Some embodiments use no electrical bias, allowing the $B_{18}$ ions to drift toward the substrate with the gas flow. In embodiments wherein an electrical bias is used, a bias of 100 V to 300 V DC or root-mean-square RF at a power level of 10 W to 500 W may be used. In some embodiments, 200 V DC is provided at 100 W of power.

In an ion implanter device, $B_{18}$ vapor is passed through an ionizing zone in which an electric field ionizes the $B_{18}$ molecules. A magnetic mass selector produces a beam of $B_{18}$ ions which are focused and directed toward the substrate. Each boron cluster will generally have kinetic energy between about 2 keV and about 20 keV, which is equivalent to each boron atom having kinetic energy between about 0.1 keV and about 1.1 keV. The beam current may be between about 0.1 mA and about 5.0 mA to deliver equivalent ion current between about 2 mA and about 100 mA of individual boron ions.

Octadecaborane ions disrupt the crystal structure of a substrate surface as they implant, and are thus self-amorphizing. The large ions impact the substrate surface, substantially melting the surface in the immediate vicinity of the impact. As the ions pass into the surface, they form tiny impact craters, substantially disrupting the crystal lattice. Hydrogen atoms are stripped from the ion and diffuse out of the substrate, leaving the boron cluster to barrel through successive layers of the crystal surface. As the large clusters move through the crystal, fragments of boron break off from the main cluster. These fragments may be single boron atoms or clusters of a few boron atoms. The small clusters are better able to penetrate the crystal lattice with low energy by channeling through the empty spaces, but because the large cluster is amorphizing its immediate environment, movement of most small clusters is diverted laterally, causing lateral dispersion of boron atoms.

The inventors have found that annealing processes involving melting the surface of the substrate, and sub-melt annealing processes involving rapid repeated heating and cooling are more effective for activating boron macromolecule implants than traditional sub-melt anneal processes. While not wishing to be bound by theory, it is thought that implantation of $B_{18}$ clusters amorphize the surface of the substrate to a degree much greater than implantation of smaller particles, so that standard sub-melt anneal processes do not fully recrystallize the substrate. Additionally, $B_{18}$ clusters do not necessarily fragment entirely into individual boron atoms upon implantation, so melting assists in completing the fragmentation in-situ. In some embodiments, due to the ability of $B_{18}$ clusters to amorphize the surface of a substrate without creating EOR defects, ultra-shallow junctions having little or no leakage due to EOR defects may be created using $B_{18}$ implantation followed by melt annealing.

Figure 2:
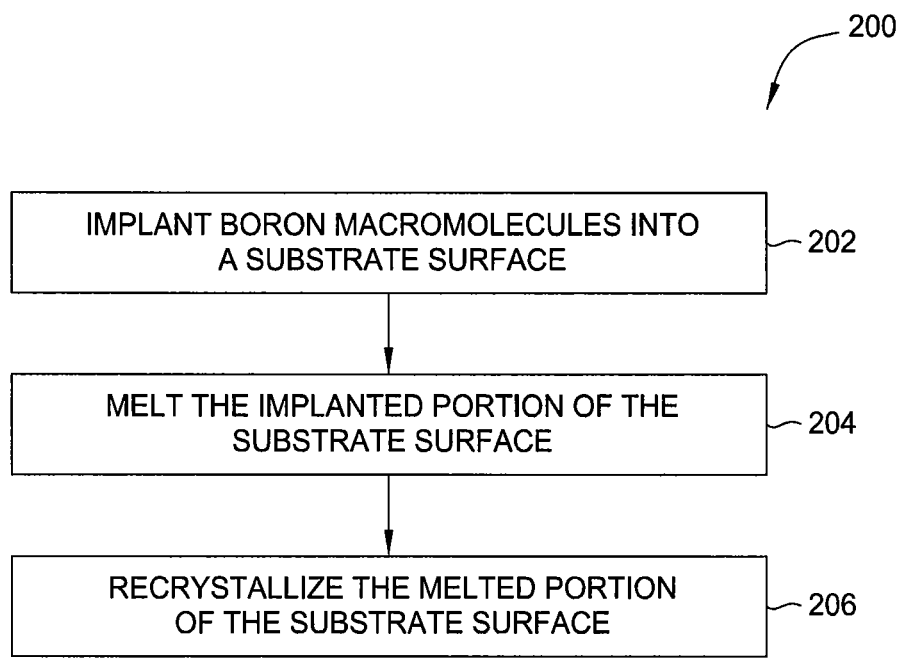
FIG. 2 is a flow diagram summarizing a method according to one embodiment.

FIG. 2 summarizes a method 200 of doping a substrate with boron according to one embodiment of the invention. Boron macromolecules are implanted into the surface of the substrate at 202. Octadecaborane or other stable macromolecules containing a large amount of boron, such as, but not limited to, icosaborane ($B_{20}H_{26}$), triantaborane ($B_{30}H_x$), and sarantaborane ($B_{40}H_x$) may be useful for certain embodiments. Combinations or mixtures of the above may also be used. Implantation may be accomplished using a plasma immersion apparatus or a beam implant apparatus to ionize the boron clusters and direct them toward the substrate. A DC or RF bias may be applied to the substrate to tune the implant energy.

The implanted portion of the substrate surface is melted at 204. A melt heating process suitable for treatment of substrates implanted with octadecaborane may be administered using any convenient source of energy. A substrate may be heated by conduction or by radiant heating with electromagnetic radiation. The substrate may be disposed on a heated support or may be subjected to irradiation with visible, infrared, or microwave radiation. A heated support may be heated using resistive heating embedded within the support, or by providing conduits within the support for flowing hot fluids. The radiation may be coherent or incoherent, focused or unfocused, monochromatic or polychromatic, or polarized or unpolarized to any degree. The radiation may be delivered by any combination of one or more lasers, flash lamps, arc lamps, or filament lamps. In some embodiments, the entire substrate may be treated at once, while in other embodiments, portions of the substrate may be treated consecutively. In some embodiments, an energy absorbing film, such as a carbon film, may be applied over the substrate to improve application of energy to the substrate surface, and to reduce loss of boron from sublimation as the substrate is heated. In some embodiments, the substrate surface may be heated with radiant energy while the bulk of the substrate is cooled using a cool support.

The portion of the substrate implanted with octadecaborane is heated to a temperature at or above the melting point of the implanted portion. In some embodiments, only the implanted surface is melted, while the bulk of the substrate remains crystalline. Due to the extent of amorphizing accompanying octadecaborane implantation in some embodiments, it may be sufficient to heat the surface to a temperature at or above the melt temperature of the amorphous material, which will generally be less than that of the corresponding crystalline material. For embodiments in which a silicon substrate is treated, a temperature of 1,200° C. or more may suffice to melt the amorphized portion of the surface. Because amorphous silicon melts at a lower temperature than crystalline silicon, the amorphized portion melts at this temperature, but the underlying crystalline phase does not. To minimize any substrate damage due to thermal stress, it may be advantageous to heat the bulk of the substrate to an intermediate temperature. In an exemplary embodiment, the substrate support may heat the substrate to a temperature of 500° C. or more, and a radiant energy source may be used to heat portions of the substrate to the melt temperature. Very fast heating of the melt zone is generally preferred to achieve melting of the amorphous phase before it crystallizes. In some embodiments, nanosecond pulsed lasers having pulse duration from a few nanoseconds to about 200 nanoseconds, such as between 10 nsec and 100 nsec, for example 20 nsec, may be used to melt the amorphous phase.

After melting, the melted portions of the substrate are recrystallized at 206. In many embodiments, the recrystallization is performed in a way that promotes formation of a crystal lattice including the implanted boron atoms. In this way, the recrystallization is similar to an annealing process. To promote crystal formation, it is generally preferred to cool the melted portions at a rate slower than would be achieved through normal conductive or radiative cooling. In some embodiments, it may be advantageous to maintain the temperature of the substrate at 500° C. or more for up to 10 minutes, such as between about 1 minute and about 10 minutes, for example about 3 minutes, following melting. In other embodiments, it may be useful to cool the implanted portion of the substrate surface at a rate not higher than about 100° C./sec, such as between about 1° C./sec and about 50° C./sec, for example about 10° C./sec. In still other embodiments, a slow cooling rate may be combined with periods of constant temperature to accomplish the recrystallization.

A substrate to be implanted as described herein may be subjected to a preclean process. The solution may have a concentration of about 0.1 to about 10.0 weight percent HF and be used at a temperature of about 20° C. to about 30° C. In an exemplary embodiment, the solution has about 0.5 weight percent of HF and a temperature of about 25° C. In another exemplary embodiment, the solution has about 1.0 weight percent of HF and a temperature of about 25° C. The substrate may be exposed to the HF solution form a duration from about 10 seconds to about 60 seconds. Any unwanted oxide is removed from the substrate by the etching action of the HF solution. A brief exposure of the substrate to the solution may be followed by a rinse step in de-ionized water and a bake step. The bake step may be performed under an inert atmosphere, such as nitrogen gas, helium, or argon, at a temperature selected to volatilize any remaining fugitive species from the surface of the substrate. In one embodiment, the substrate may be exposed to a temperature of between about 200° C. and about 600° C. for about 60 seconds.

A substrate implanted with boron as described herein may be subjected to a stripping process following the anneal process to remove any residual high surface concentration of boron. In some embodiments, the substrate is exposed to a hydrogen-containing gas to generate volatile hydrides. In some embodiments, the hydrogen-containing gas may be a plasma. For example, hydrogen gas or ammonia, with or without plasma, may be used to convert dopants at the surface of the substrate into volatile hydrides. Boron may react to form various volatile boron hydrides such as borane, diborane, or other volatile borane oligomers. In one exemplary embodiment, the substrate may be exposed to a hydrogen plasma for between about 10 seconds and about 30 seconds, such as about 15 seconds, at a temperature of between about 100° C. and about 300° C., such as about 200° C., to reduce the surface concentration of dopants. The hydrogen plasma may be generated in-situ or remotely, and may accompany a non-reactive carrier gas such as argon or helium. The carrier gas flow may be established at a rate between about 1,000 sccm and about 2,000 sccm, such as about 1,500 sccm, and a pulse of hydrogen gas added. The pulse of hydrogen gas may be supplied at a flow rate between about 100 sccm and about 500 sccm, such as about 300 sccm, for an interval of about 10 seconds to about 30 seconds, such as about 15 seconds. Following exposure, the hydrogen gas is stopped and the carrier gas purges any remaining volatile hydrides from the chamber. The chamber may also be pumped-down to a low pressure to remove any remaining fugitive hydrides.

Figure 3:
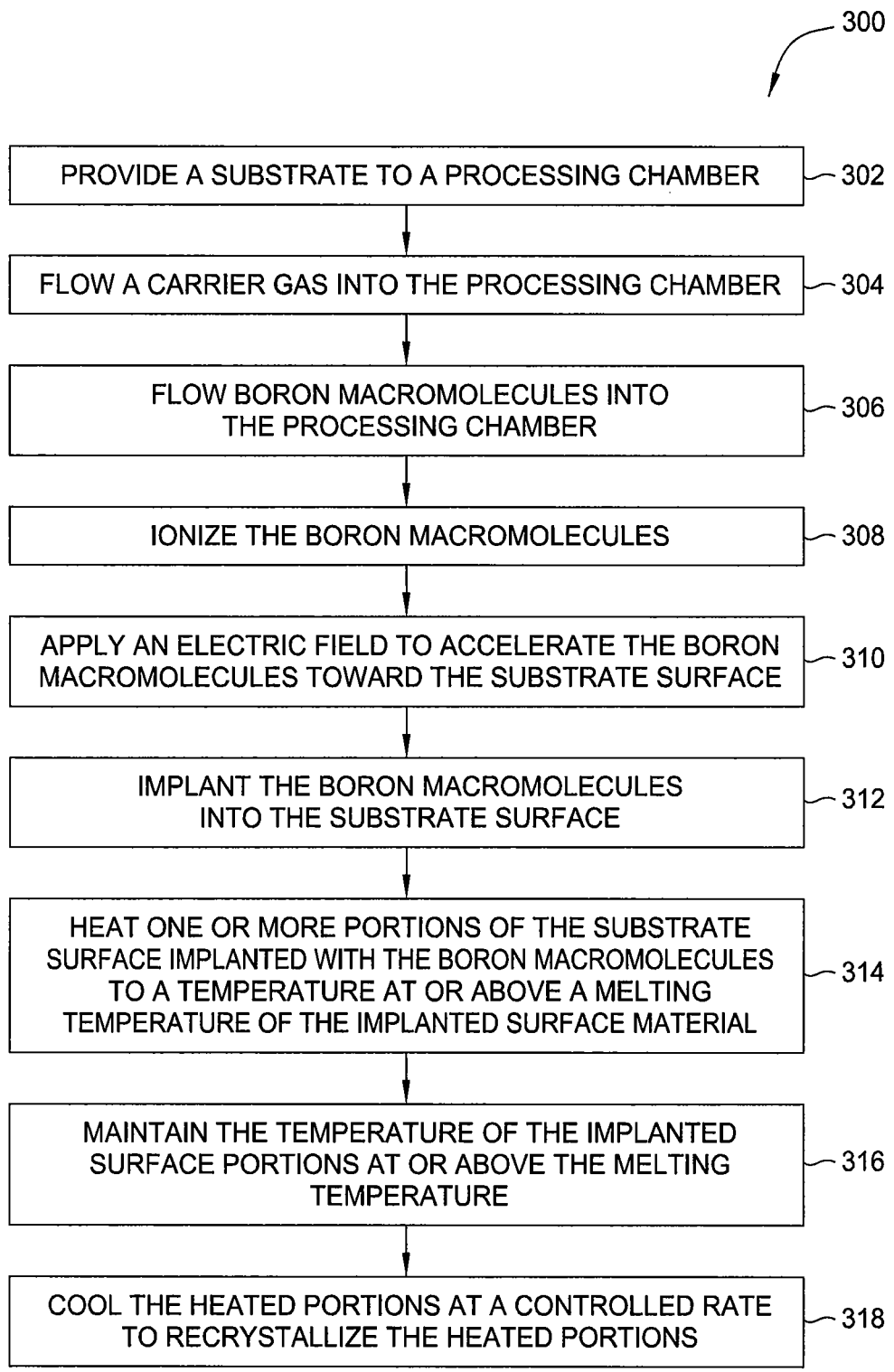
FIG. 3 is a flow diagram summarizing a method according to another embodiment.

FIG. 3 summarizes a method 300 according to another embodiment of the invention. A substrate is disposed in a processing chamber at 302. Flow of a carrier gas is established at 304. The carrier gas may be any non-reactive gas, such as helium, argon, or nitrogen gas. In some embodiments, the carrier gas flow rate may be between about 1,000 sccm and about 5,000 sccm, such as between about 2,000 sccm and about 4,000 sccm, for example about 3,000 sccm. A precursor comprising boron macromolecules is added at 306. The boron precursor may be added to the carrier gas stream outside the processing chamber or may be added directly to the processing chamber. The boron precursor may be provided at a flow rate between about 100 sccm and about 500 sccm, such as between about 200 sccm and about 400 sccm, for example about 300 sccm. The boron precursor will generally be provided at or above a vaporization temperature to maintain the boron precursor in a vapor state. For $B_{18}$, the boron precursor may be provided at a temperature between about 100° C. and about 400° C., such as about 250° C.

The carrier gas and boron precursor flow into one or more ionizing zones near or within the processing chamber. At 308, ionizing energy is applied to ionize the boron precursor without decomposing the boron macromolecules, which then emerge through a gas distributor into the processing chamber. In some embodiments, the ionizing energy may be applied by coupling an electric field into the ionizing zones. The electric field may be static, such as a DC bias, or varying, such as that generated by application of RF power, and may be coupled into the ionizing zones by capacitative or inductive means. In one embodiment, inductive ionizing zones are provided outside the processing chamber, with one or more conduits to carry gas to the ionizing zones from the processing chamber. An electric field is coupled into each ionizing zone by providing one or more torroidal cores disposed around the ionizing zones. The one or more torroidal cores are energized with RF power to generate an electric field inside the ionizing zones. For most embodiments, the ionizing energy may be provided at a power level of between about 100 W and about 500 W, such as about 300 W.

At 310, an electric field may be applied to accelerate the ionized boron macromolecules toward the substrate surface. This may be a static field, such as a DC bias applied to the substrate support, the gas distributor, or both, or it may be a varying field such as an RF-driven field. Application of an electric field is an optional step used to adjust the energy of the ionized boron macromolecules as they travel toward the substrate surface. Some embodiments may allow the ions to drift toward the surface. If an electric field is used, it will preferably be a weak field, applied at a power level between about 50 W and about 500 W, such as about 100 W. In some embodiments, the ionized boron macromolecules will travel toward the substrate surface with kinetic energy between about 100 eV and about 2,000 eV. Individual embodiments may energize the ions with any particular value or range of kinetic energy between these two values. A single embodiment may also feature ions with a distribution of energies within this range. For example, a first portion of the ionized boron macromolecules may have higher kinetic energy than a second portion of the ionized boron macromolecules due to thermal, pressure, or electrical gradients or fluctuations.

The ionized boron macromolecules impact the substrate disposed on the substrate support at 312, implanting into the substrate surface. The macromolecules generally carry enough kinetic energy to disrupt the crystal matrix of the substrate surface as they impact, amorphizing the surface. Additionally, the boron macromolecules fragment as they bore into the substrate surface. The fragments generally diverge laterally from the main macromolecule due to the amorphizing process, resulting in an as-implanted concentration profile that is relatively abrupt. In some embodiments, the maximum concentration of as-implanted boron may be between about 5 and 15 nm below the surface, such as about 10 nm below the surface, and may be between about $10^{19}$ cm$^{-3}$ and about $10^{21}$ cm$^{-3}$ at that depth. The as-implanted concentration will generally fall at a rate of 2-20 nm/dec., depending on the implant energy. The implant layer will generally be between about 30 nm and about 150 nm thick, such as about 50 nm thick. The resulting implant layer will be completely amorphized by action of the boron macromolecules, with boron atoms or small boron clusters of 2 to 4 boron atoms each, dispersed through the layer.

At 314, heating energy is applied to one or more implanted portions. The heating energy is selected to raise the temperature of the implanted area to the melting point, or above. The heating energy may be applied in any convenient way. For example, electromagnetic energy or radiant energy may be projected toward the implanted area to melt portions thereof. Additionally, background heating may be applied to pre-heat the implanted area, an area of the substrate containing the implanted area to be melted, or the entire substrate. For example, a heated substrate support may apply conductive heating energy to the substrate to raise its temperature to between about 400° C. and about 700° C., maintaining that temperature while individual implanted areas are melted by application of incremental heating energy. Radiant energy for melting implanted areas may be delivered by laser, heat lamp, flash lamp, or the like, and may be pulsed or continuous, coherent or incoherent, monochromatic or polychromatic, polarized or unpolarized to any degree. Portions of the substrate may be irradiated consecutively, or the entire substrate irradiated simultaneously. The implanted portions may be heated to a temperature between about 1,100° C. and about 1,400° C., depending on the embodiment. Melting of amorphized silicon generally occurs at a lower temperature than melting of crystalline silicon, so embodiments wherein the substrate material is predominantly silicon may feature heating implanted portions to about 1,200° C. The melt temperature is selected to melt the amorphous layer without melting the underlying crystalline layer. It is generally desired to heat the portions to be melted at a high rate, so that the amorphous portion is heated faster than heat can be conducted away by the substrate material, and is melted before it can recrystallize. When amorphous silicon is slowly heated to near its melting point, it undergoes solid phase epitaxy, converting to crystalling silicon with a higher melting point. Very rapid heating may melt the amorphous portion before it can recrystallize.

At 316, the temperature of the melted portions of the implanted surface is maintained above the melting temperature for a period of time to allow complete dissociation of remaining boron fragments and some diffusion of boron out of the maximum concentration layer. Most embodiments using nanosecond pulsed lasers will feature melt duration from tens to hundreds of nanoseconds. In some embodiments, however, melt duration may be between a few milliseconds and about 0.5 seconds, such as about 10 msec.

At 318, the heated portions of the substrate surface are cooled at a controlled rate to recrystallize or resolidify the substrate surface. In general this cooling rate will be slower than would be experienced through simple de-energizing of the heating apparatus to allow controlled recrystallization. This controlled recrystallization process effectively activates the boron dopant atoms derived from the implanted boron macromolecules by moving them to crystal lattice positions and freezing them in place. In some embodiments, heating energy may be applied to melted implant areas control the rate of cooling of melted implant by adjusting the energy-time profile of the heating source. For example, the profile of the pulse of a nanosecond laser may be adjusted using pulse modification optics, or the shape of a discharge voltage pulse applied to one or more flash lamps may be adjusted. The heating energy may be electromagnetic energy or radiant energy according to any of the methods described above. In other embodiments, heating energy may be applied to the entire substrate to maintain its temperature at an intermediate temperature for a period of time to accomplish the recrystallization process. For example, a substrate may be recrystallized by maintaining its temperature between about 400° C. and about 700° C. for between about 1 minute and about 10 minutes. For example, in one embodiment, a substrate may be recrystallized by maintaining its temperature at about 500° C. for about 60 seconds. The controlled cooling process anneals the substrate surface to eliminate crystal defects from the substrate surface, distribute the dopants, and activate the dopants.

Figure 4:
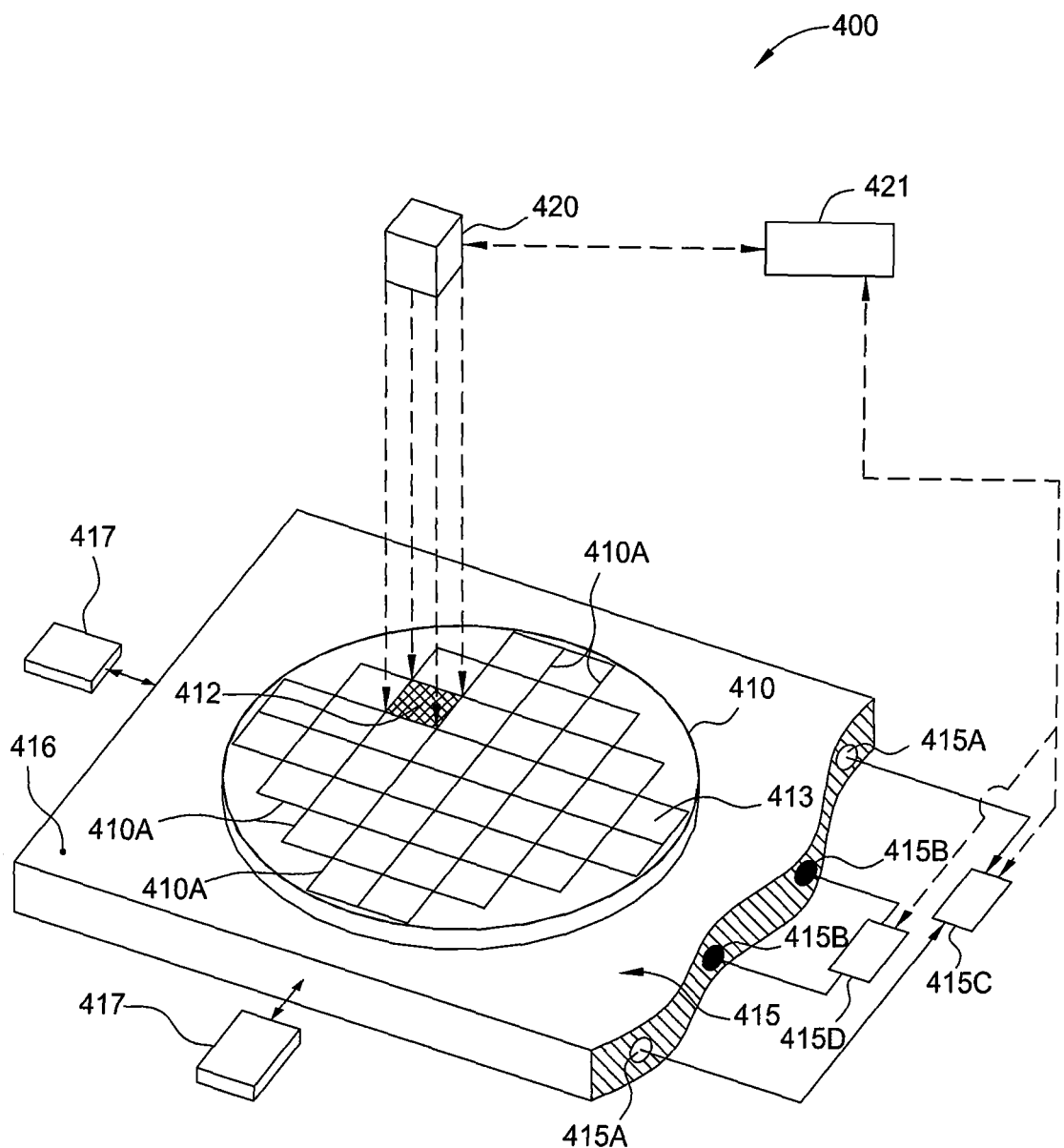
FIG. 4 is a schematic illustration of an anneal system that may be used to practice embodiments described herein.

FIG. 4 schematically illustrates an anneal system 400 that may be used to practice embodiments of the present invention. The anneal system 400 comprises an energy source 420 which is adapted to project an amount of energy on a defined region, or an anneal region 412, of a substrate 410 to preferentially melt certain desired regions within the anneal region 412.

In one example, as shown in FIG. 400, only one defined region of the substrate 410, such as an anneal region 412, is exposed to the radiation from the energy source 420 at any given time. The substrate 410 moves relative to the energy source 420 so that other regions on the substrate 410 may be sequentially exposed to the energy source 420.

In one aspect of the invention, multiple areas of the substrate 410 are sequentially exposed to a desired amount of energy delivered from the energy source 420 to cause the preferential melting of desired regions of the substrate 410.

In general, the areas on the surface of the substrate 410 may be sequentially exposed by translating the substrate 410 relative to the output of the energy source 420 (e.g., using conventional X/Y stages, precision stages) and/or translating the output of the energy source 420 relative to the substrate 410.

The substrate 410 may be positioned on a heat exchanging device 415 configured to control over all temperature of the substrate 410. The heat exchange device 415 may be positioned on one or more conventional electrical actuators 417 (e.g., linear motor, lead screw and servo motor), which may be part of a separate precision stage (not shown), configured to control the movement and position of substrate 410. Conventional precision stages that may be used to support and position the substrate 410, and the heat exchanging device 415, may be purchased from Parker Hannifin Corporation, of Rohnert Park, Calif.

In one aspect, the anneal region 412 is sized to match the size of the die 413 (e.g., 40 dice are shown in FIG. 4), or semiconductor devices (e.g., memory chip), that are formed on the surface of the substrate 410. In one aspect, the boundary of the anneal region 412 is aligned and sized to fit within the "kurf" or "scribe" lines 410A that define the boundary of each die 413.

Sequentially placing anneal regions 412 so that they only overlap in the naturally occurring unused space/boundaries between die 413, such as the scribe or kurf lines 410A, reduces the need to overlap the energy in the areas where the devices are formed on the substrate 410 and thus reduces the variation in the process results between the overlapping anneal regions 412.

In one embodiment, prior to performing the annealing process the substrate 410 is aligned to the output of the energy source 420 using alignment marks typically found on the surface of the substrate 410 and other conventional techniques so that the anneal region 412 can be adequately aligned to the die 413.

The energy source 420 is generally adapted to deliver electromagnetic energy to preferentially melt certain desired regions of the substrate surface. Typical sources of electromagnetic energy include, but are not limited to an optical radiation source (e.g., laser), an electron beam source, an ion beam source, and/or a microwave energy source.

In general, the substrate 410 is placed within an enclosed processing environment (not shown) of a processing chamber (not shown) that contains the heat exchanging device 415. The processing environment within which the substrate 410 resides during processing may be evacuated or contain an inert gas that has a low partial pressure of undesirable gases during processing, such as oxygen.

In one embodiment, it may be desirable to control the temperature of the substrate 410 during thermal processing by placing a surface of the substrate 410, illustrated in FIG. 4, in thermal contact with a substrate supporting surface 416 of the heat exchanging device 415. The heat exchanging device 415 is generally adapted to heat and/or cool the substrate 410 prior to or during the annealing process. In this configuration, the heat exchanging device 415, such as a conventional substrate heater available from Applied Materials Inc., Santa Clara, Calif., may be used to improve the post-processing properties of the annealed regions of the substrate 410.

In one embodiment, the substrate may be preheated prior to performing the annealing process so that the energy required to reach the melting temperature is minimized, which may reduce any induced stress due to the rapid heating and cooling of the substrate 410 and also possibly reduce the defect density in the resolidified areas of the substrate 410. In one aspect, the heat exchanging device 415 contains resistive heating elements 415A and a temperature controller 415C that are adapted to heat a substrate 410 disposed on the substrate supporting surface 416. The temperature controller 415C is in communication with the controller 421.

In one aspect, it may be desirable to preheat the substrate to a temperature between about 20° C. and about 750° C. In one embodiment, where the substrate is formed from a silicon containing material it may be desirable to preheat the substrate to a temperature between about 20° C. and about 500° C. In another embodiment, where the substrate is formed from a silicon containing material it may be desirable to preheat the substrate to a temperature between about 200° C. and about 480° C. In another embodiment, where the substrate is formed from a silicon containing material it may be desirable to preheat the substrate to a temperature between about 250° C. and about 300° C.

In another embodiment, it may be desirable to cool the substrate during processing to reduce any diffusion due to the energy added to the substrate during the annealing process and/or increase the regrowth velocity after melting to increase the amorphization of the various regions during processing. In one configuration, the heat exchanging device 415 contains one or more fluid channels 415B and a cryogenic chiller 415D that are adapted to cool a substrate disposed on the substrate supporting surface 416. In one embodiment, a conventional cryogenic chiller 415D, which is in communication with the controller 421, is adapted to deliver a cooling fluid through the one or more fluid channels 415B. In one aspect, it may be desirable to cool the substrate to a temperature between about −240° C. and about 20° C.

During a pulsed laser anneal process, a substrate being processed moves relative to an energy source so that portions of the substrate are exposed to the energy source sequentially. The relative movement may be a stepping motion. For example, the substrate may be moved to and maintained at a first position so that a first area on the substrate is aligned with the energy source. The energy source then projects a desired amount of energy toward the first area on the substrate. The substrate is then moved to a second position to a second area with the energy source. The relative movement between the substrate and the energy source is stopped temporarily when the energy source projects energy to the substrate so that the energy is projected precisely and uniformly to a desired area. However, this stepping motion involves accelerating and decelerating in every step which significantly slows the down the process.

Figure 5:
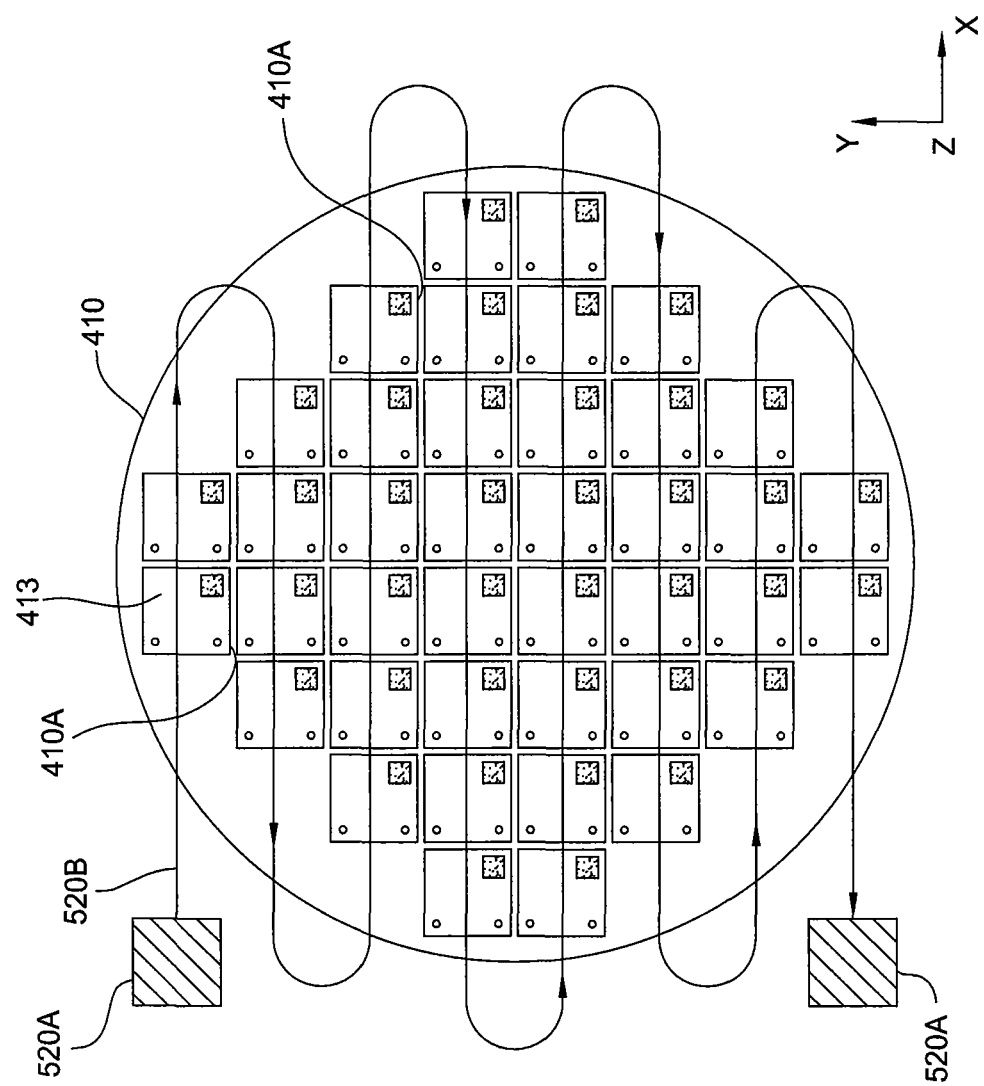
FIG. 5 is a schematic illustration of a top view of a substrate that contains forty square shaped dice that are arranged in an array.

FIG. 5 schematically illustrates a top view of a substrate 410 that contains forty square shaped dice 413 that are arranged in an array. The dice 413 are separated from one another by areas marked by scribe lines 410A. Energy projection region 520A indicates the area over which energy source 420 (shown in FIG. 4) is adapted to deliver an energy pulse. In general, the energy projection region 520A may cover an area equal to or greater than the area of each die 413, but smaller than the area of each die 413 plus the area of the surrounding scribe lines 410A, so that the energy pulse delivered in the energy projection region 520A completely covers the die 413 while not overlapping with the neighboring dice 413.

To perform the annealing process on multiple dice 413 spread out across the substrate surface, the substrate and/or the output of the energy source 420 needs to be positioned and aligned relative to each die. In one embodiment, curve 520B illustrates a relative movement between the dies 413 of the substrate 410 and the energy projection region 520A of the energy source 420, during a sequence of annealing process as that are performed on each die 413 on the surface of the substrate. In one embodiment, the relative movement may be achieved by translating the substrate in x and y direction so that they follow the curve 520B. In another embodiment, the relative movement may be achieved by moving the energy projection region 520A relative to a stationary substrate 410.

Additionally, a path different than 520B may be used to optimize throughput and process quality depending on a particular arrangement of dies.

In one embodiment, during an annealing process, the substrate 410 moves relative to the energy projection region 520A, such as shown by curve 520B of FIG. 5. When a particular die 413 is positioned and aligned within the energy projection region 520A, the energy source 420 projects a pulse of energy towards the substrate 410 so that the die 413 is exposed to a certain amount of energy over a defined duration according to the particular anneal process recipe. The duration of the pulsed energy from the energy source 420 is typically short enough so that the relative movement between the substrate 410 and the energy projection region 520A does not cause any "blur", i.e. non uniform energy distribution, across each die 413 and it will not cause damage to the substrate.

Figure 6:
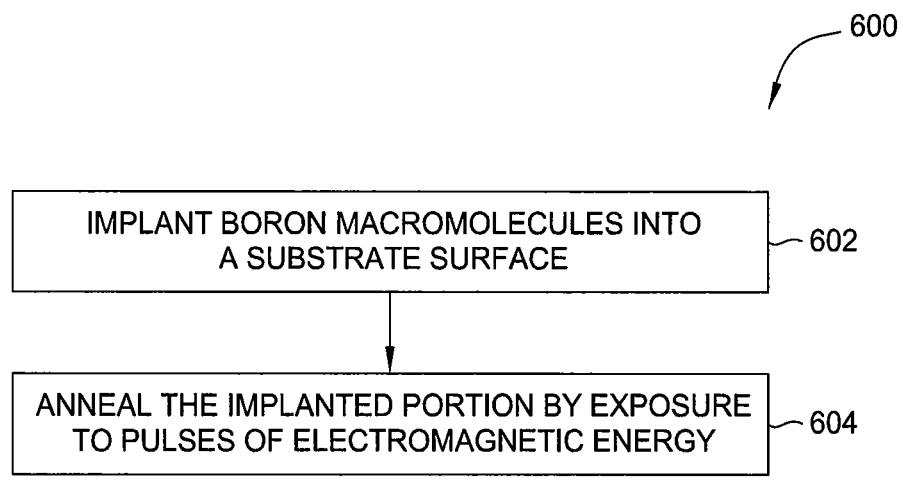
FIG. 6 is a flow diagram summarizing a method according to another embodiment.

A substrate implanted with $B_{15}$ ions may be annealed using a sub-melt anneal process involving rapid repeated heating and cooling of implanted regions. FIG. 6 is a flow diagram summarizing a method 600 according to another embodiment. At 602, a substrate surface is implanted with boron macromolecules according to any desired embodiment. At 604, the implanted portion is annealed by exposure to pulses of electromagnetic energy. The pulses of electromagnetic energy rapidly heat and cool the implanted portion repeatedly to anneal the substrate.

In one embodiment, the pulses of electromagnetic energy comprise at least about 30 pulses of electromagnetic energy of substantially the same energy flux and duration. In one embodiment, the number of pulses may be at least about 30, or at least about 50, or at least about 100, such as between about 30 and about 100,000 pulses, or between about 50 and about 10,000 pulses, or between about 100 and about 1,000 pulses, or between about 200 and about 500 pulses. In one embodiment, the energy flux of each pulse is between about 0.1 J/cm$^2$ and about 2.0 J/cm$^2$, such as between about 0.2 J/cm$^2$ and about 1.0 J/cm$^2$, for example about 0.25 J/cm$^2$. In one embodiment, the pulses comprise laser light. Each pulse may have duration between about 1 nsec and about 10 µsec, such as between about 10 nsec and about 100 nsec, for example about 20 nsec. The number of pulses needed will generally be inversely proportional to the fluence and duration of each pulse.

Each pulse of electromagnetic energy accomplishes a micro-anneal cycle in the energized area of the substrate. Unfragmented boron clusters are broken up, and individual boron and silicon atoms are moved fractions of a unit cell dimension with each pulse. Boron and silicon atoms occupying crystal lattice positions do not receive enough energy from each pulse to dislodge them, but those atoms occupying spaces between crystal lattice locations are moved incrementally toward unoccupied lattice positions. Incident energy flux between pulses declines to allow energy from each pulse to dissipate through the crystal lattice before the next pulse is delivered. In one embodiment, incident energy flux may decline to near zero between pulses. In another embodiment, incident energy flux declines to allow net energy flux out of the anneal zone. Thus, while standard sub-melt techniques require exposing boron-doped substrates to spikes of radiation lasting 20 µsec or more, repeated short pulses may accomplish an anneal process at much lower total durations and power requirements. The period of time between each pulse relative to the duration of each pulse may be between about 50% and about 200%, such as between about 100% and about 150%, for example about 125%. A rest period below about 100% of pulse duration allows the net energy balance of the implanted region to decline to a non-zero level below the peak energy density experienced during a pulse before the next pulse begins. A rest period above about 125% of a pulse duration allows the net energy balance to return to a rest state prior to the next pulse.

In one example, a substrate was implanted with $B_{18}$ ions to a dose of $2 \times 10^{15}$ cm$^{-2}$ at an equivalent boron ion energy of 500 eV. After 30 pulses with a 20 nsec laser delivering 0.234 J/cm$^2$ at a wavelength of 532 nm over a total duration of about 1.4 µsec, $R_s$ was about 500Ω. After 1000 pulses over a duration of about 45 µsec, $R_s$ was about 400Ω.

In another example, a substrate was implanted with $B_{18}$ ions at a similar dose and ion energy. After 300 pulses with a 20 nsec laser delivering 0.234 J/cm$^2$ at a wavelength of 532 nm over a total duration of about 13.5 µsec, boron ion concentration of $10^{19}$ cm$^{-3}$ was found at a depth of about 147 Å, with concentration profile at that depth of about 5 Å/dec.

While the foregoing is directed to embodiments of the invention, other and further embodiments of the invention may be devised without departing from the basic scope thereof, and the scope thereof is determined by the claims that follow.

What is claimed is:

1. A method of treating a substrate, comprising:
   disposing the substrate in a processing chamber;
   providing a pulse of a vapor of boron macromolecules into a carrier gas, wherein the pulse of the vapor of boron macromolecules is provided for about 1 second at a flow rate between about 500 sccm and about 2,000 sccm;
   forming a plasma from the vapor of boron macromolecules and the carrier gas in the processing chamber;
   immersing the substrate in the plasma;
   implanting boron from the plasma into a surface of the substrate; and
   subjecting the implanted surface to a melting and recrystallization process using nanosecond pulses of laser energy.

2. The method of claim 1, wherein the boron macromolecules comprise clusters containing at least sixteen boron atoms.

3. The method of claim 1, wherein forming a plasma from the vapor of boron macromolecules and the carrier gas comprises coupling RF power between about 100 W and about 500 W into the vapor of boron macromolecules and the carrier gas.

4. The method of claim 3, wherein implanting the boron from the plasma into the surface of the substrate comprises applying an electrical bias to the substrate between about 100 V and about 300 V.

5. The method of claim 3, wherein flowing the vapor of boron macromolecules through the processing chamber comprises pulsing the vapor into the processing chamber.

6. The method of claim 1, wherein the plurality of pulses of laser energy comprise about 30 to about 100,000 pulses and are delivered at a pulse duration between about 10 nanosecond and about 100 nanosecond.

7. The method of claim 6, wherein the melting and recrystallization process comprises crystallizing the melted portion of the substrate surface.

8. A method of treating a substrate, comprising:
   forming an inductive plasma of a gas mixture comprising a carrier gas and boron macromolecules inside a processing chamber, wherein the inductive plasma of the gas mixture is formed by providing a pulse of a vapor of the boron macromolecules into the carrier gas for about 1 second at a flow rate between about 500 sccm and about 2,000 sccm;
   immersing the substrate in the plasma inside the processing chamber to implant boron from the plasma into a surface of the substrate; and
   annealing successive portions of the implanted surface of the substrate by a melting and resolidification process using nanosecond pulses of laser energy.

9. The method of claim 8, wherein the boron macromolecules comprise octadecaborane.

10. The method of claim 8, wherein forming the plasma comprises applying electrical energy to the gas mixture at a power level above a level that ionizes the boron macromolecules and below a level that fragments the boron macromolecules.

11. The method of claim 8, wherein annealing successive portions of the substrate comprises melting and recrystallizing each successive portion of the substrate.

12. The method of claim 11, wherein the boron macromolecules comprise octadecaborane and the plasma is an inductive plasma.

13. The method of claim 12, wherein forming the plasma comprises applying electrical energy to the gas mixture at a power level above a level that ionizes the boron macromolecules and below a level that fragments the boron macromolecules, and exposing the substrate to the plasma comprises applying an electrical bias to the substrate.

14. The method of claim 13, wherein the plurality of pulses of laser energy comprise about 30 to about 100,000 pulses and are delivered at a pulse duration between about 10 nanosecond and about 100 nanosecond.

15. A method of treating a substrate, comprising:
   providing a pulse of a vapor of boron macromolecules into a carrier gas within a processing chamber, wherein the pulse of the vapor of boron macromolecules is provided for about 1 second at a flow rate between about 500 sccm and about 2,000 sccm;

immersing a substrate in a plasma formed from the vapor of boron macromolecules and the carrier gas to implant boron from the plasma into a surface of the substrate; and exposing at least the implanted surface of the substrate to a plurality of pulses of laser energy.

16. The method of claim 15, wherein the boron macromolecules comprises boron hydrides $B_xH_y$, wherein x is between about 6 and about 20, and y is between about 12 and about 24.

17. The method of claim 16, wherein the boron macromolecules comprise clusters containing at least sixteen boron atoms.

* * * * *